United States Patent
Choi et al.

(10) Patent No.: US 9,287,298 B2
(45) Date of Patent: Mar. 15, 2016

(54) LIQUID CRYSTAL DISPLAY AND MANUFACTURING METHOD THEREOF

(71) Applicant: SAMSUNG DISPLAY CO., LTD., Yongin, Gyeonggi-Do (KR)

(72) Inventors: Jae Ho Choi, Asan-si (KR); Jae-Hyun Park, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/554,833

(22) Filed: Nov. 26, 2014

(65) Prior Publication Data

US 2015/0200210 A1 Jul. 16, 2015

(30) Foreign Application Priority Data

Jan. 13, 2014 (KR) .................. 10-2014-0004038

(51) Int. Cl.
*H01L 29/10* (2006.01)
*H01L 27/12* (2006.01)

(52) U.S. Cl.
CPC .......... *H01L 27/124* (2013.01); *H01L 27/1248* (2013.01); *H01L 27/1288* (2013.01)

(58) Field of Classification Search
CPC .............. H01L 27/124; H01L 27/1248; H01L 27/1288
See application file for complete search history.

(56) References Cited

U.S. PATENT DOCUMENTS

| | | | |
|---|---|---|---|
| 8,305,516 B2 | 11/2012 | Cho et al. | |
| 8,368,836 B2 | 2/2013 | Kim et al. | |
| 8,603,914 B2* | 12/2013 | Song | G02F 1/134363 349/143 |
| 2002/0089631 A1* | 7/2002 | Lee | G02F 1/134363 349/141 |
| 2007/0046847 A1* | 3/2007 | Lee | G02F 1/1365 349/43 |
| 2009/0244418 A1* | 10/2009 | Pak | G02F 1/134309 349/39 |
| 2012/0135552 A1* | 5/2012 | Lim | G02F 1/134363 438/30 |
| 2012/0149139 A1* | 6/2012 | Tanaka | G02F 1/133707 438/34 |
| 2012/0280237 A1 | 11/2012 | Kwack et al. | |
| 2013/0071973 A1* | 3/2013 | Beak | H01L 27/1288 438/158 |
| 2013/0087794 A1 | 4/2013 | Kwack | |

FOREIGN PATENT DOCUMENTS

| | | |
|---|---|---|
| JP | 2009-271105 | 11/2009 |
| KR | 10-0476047 | 3/2005 |
| KR | 10-2008-0075717 | 8/2008 |
| KR | 10-2011-0071313 | 6/2011 |
| KR | 10-2013-0065246 | 6/2013 |

* cited by examiner

*Primary Examiner* — Reema Patel
*Assistant Examiner* — Syed Gheyas
(74) *Attorney, Agent, or Firm* — F. Chau & Associates, LLC

(57) ABSTRACT

A liquid crystal display includes: a first substrate, a gate line and a data line disposed on the first substrate, a thin film transistor connected to the gate line and the data line, a first passivation layer disposed on the thin film transistor, a first electrode disposed on the first passivation layer, a second passivation layer disposed on the first electrode and a second electrode disposed on the second passivation layer. A first edge of the first electrode and a second edge of the second passivation layer have substantially the same plane shape as each other, and the second edge of the second passivation layer protrudes more than the first edge of the first electrode.

26 Claims, 28 Drawing Sheets

LIQUID CRYSTAL DISPLAY AND MANUFACTURING METHOD THEREOF

CROSS-REFERENCE TO RELATED APPLICATION

This application claims priority to Korean Patent Application No. 10-2014-0004038 filed on Jan. 13, 2014, the disclosure of which is hereby incorporated by reference herein in its entirety.

TECHNICAL FIELD

The present disclosure relates to a liquid crystal display and a manufacturing method thereof.

DISCUSSION OF THE RELATED ART

A liquid crystal display, which is one of the most common types of flat panel displays currently in use, is a display device which rearranges liquid crystal molecules of a liquid crystal layer by applying voltages to electrodes to control an amount of transmitted light.

The liquid crystal display has a benefit of relatively easily forming a thin film, but as there may be a difficulty in that side visibility may deteriorate compared with front visibility. To solve this difficulty, various types of alignments of the liquid crystal and driving methods have been developed. As a method for implementing a wide viewing angle, a liquid crystal display in which a pixel electrode and a common electrode are formed on one substrate has received attention.

In such a liquid crystal display, at least one of two field generating electrodes of the pixel electrode and the common electrode has a plurality of cutouts and a plurality of branch electrodes defined by the plurality of cutouts.

When two field generating electrodes are formed on one display panel, different photomasks may be required to form the respective field generating electrodes, and accordingly manufacturing costs may be increased.

SUMMARY

An exemplary embodiment of the present invention provides a liquid crystal display that can form two field generating electrodes on one display panel while preventing an increase in manufacturing costs, and a method for manufacturing the same.

A liquid crystal display according to an exemplary embodiment of the present invention includes: a first substrate, a gate line and a data line disposed on the first substrate, a thin film transistor connected to the gate line and the data line, a first passivation layer disposed on the thin film transistor, a first electrode disposed on the first passivation layer, a second passivation layer disposed on the first electrode, and a second electrode disposed on the second passivation layer. A first edge of the first electrode and a second edge of the second passivation layer have substantially the same plane shape as each other, and the second edge of the second passivation layer protrudes more than the first edge of the first electrode.

The first passivation layer may include a first drain contact hole exposing a drain electrode of the thin film transistor, the first electrode may include a second drain contact hole exposing the drain electrode, the second passivation layer may include a third drain contact hole exposing the drain electrode, the first drain contact hole, the second drain contact hole, and the third drain contact hole may overlap with each other, and the size of the second drain contact hole is greater than the size of the third drain contact hole.

The liquid crystal display further includes an organic layer disposed between the first passivation layer and the first electrode and the first drain contact hole is disposed in the first passivation layer and the organic layer, and an edge of the second drain contact hole and an edge of the third drain contact hole overlap with an inclined portion that forms the first drain contact hole of the organic layer.

The second electrode may be connected with the drain electrode through the first drain contact hole, the second drain contact hole, and the third drain contact hole, and the thickness of the second electrode may be greater than the thickness of the first electrode.

The thickness of the second electrode may be about two times thicker than the thickness of the first electrode.

The liquid crystal display may further include a gate signal transmission pad portion disposed in the same layer as of the data line, the gate line may include a gate pad portion, the first passivation layer may include a first pad contact hole exposing the gate pad portion and a second pad contact hole exposing the gate signal transmission pad portion, a connection member may be disposed on the first pad contact hole and the second pad contact hole, and an insulation portion disposed on the same layer as the second passivation layer and may be disposed on the connecting member. An edge of the insulation portion protrudes more than the edge of the connection member.

The data line may include a data pad portion, the first passivation layer may include a third pad contact hole exposing the data pad portion, a contact auxiliary member may be disposed on the third pad contact hole, and the second passivation layer may not overlap with the data pad portion.

A liquid crystal display according to another exemplary embodiment of the present invention includes: a first substrate, a gate line and a data line disposed on the first substrate, a thin film transistor connected to the gate line and the data line, a first passivation layer disposed on the thin film transistor, a first electrode disposed on the first passivation layer, a second passivation layer disposed on the first electrode, and a second electrode disposed on the second passivation layer. The first passivation layer may include a first drain contact hole exposing a drain electrode of the thin film transistor, the first electrode may include a second drain contact hole exposing the drain electrode, and the second passivation layer may include a third drain contact hole exposing the drain electrode. The first drain contact hole, the second drain contact hole, and the third drain contact hole overlap with each other, and the size of the second drain contact hole may be greater than the size of the third drain contact hole.

A method for manufacturing a liquid crystal display according to an exemplary embodiment of the present invention includes: forming a gate line, a data line, and a thin film transistor connected to the gate line and the data line on a first substrate, forming a first passivation layer including a first drain contact hole that exposes a drain electrode of the thin film transistor on the thin film transistor, forming a first electrode including a second drain contact hole exposing the drain electrode and a second passivation layer including a third drain contact hole exposing the drain electrode together on the first passivation layer through one photolithography process, forming a second electrode on the second passivation layer, forming the first drain contact hole, the second drain contact hole, and the third drain contact hole to be overlapped with each other, and forming the size of the second drain contact hole to be greater than the size of the third drain contact hole.

The forming the first electrode and the second passivation layer together may include: depositing a first layer on the first passivation layer, depositing a second layer on the first layer, forming a photosensitive film pattern on the second layer, etching the second layer using the photosensitive film pattern as a mask, and over-etching the first layer using the photosensitive film pattern as a mask.

The method further includes forming an organic layer between the first passivation layer and the first electrode. The first drain contact hole may be formed in the first passivation layer and the organic layer, the organic layer may include an inclined portion at the peripheral area of the first drain contact hole, and an edge of the second drain contact hole and an edge of the third drain contact hole may be formed to be overlapped with the inclined portion of the organic layer.

The second electrode may be formed to be connected with the drain electrode through the first drain contact hole, the second drain contact hole, and the third drain contact hole, and the thickness of the second electrode may be greater than the thickness of the first electrode.

The thickness of the second electrode may be about two times thicker than the thickness of the first electrode.

The second electrode may be formed to be connected with the drain electrode through the first drain contact hole, the second drain contact hole, and the third drain contact hole, and the thickness of the second electrode may be greater than the thickness of the first electrode.

The thickness of the second electrode may be about two times thicker than the thickness of the first electrode.

The gate line may include a gate pad portion, the forming of the first passivation layer may further include forming a first pad contact hole exposing the gate pad portion, the forming of the first electrode and the second passivation layer may further include forming a connection member on the first pad contact hole and forming an insulation portion formed of the same layer as the second passivation layer on the connecting member, and an edge of the insulating layer may be protruded more than an edge of the connection member.

The data line may include a data pad portion, the forming of the first passivation layer may further include forming a third pad contact hole exposing the data pad portion, the forming of the second electrode may further include forming a contact auxiliary member on the third pad contact hole, and the second passivation layer may be formed to not be overlapped with the data pad portion.

In accordance with an exemplary embodiment, a liquid crystal display is provided. The liquid crystal display includes a first substrate, a gate line including a gate electrode and a gate pad portion disposed on the first substrate, a gate insulating layer disposed on the gate line, a semiconductor layer disposed on the gate insulating layer, a plurality of ohmic contacts disposed on the semiconductor layer, a data conductor including a data line including a data pad portion, a source electrode and a drain electrode disposed on the ohmic contacts and the gate insulating layer, in which the gate electrode, the source electrode and the drain electrode together with the semiconductor layer form a thin film transistor, and a channel of the thin film transistor is disposed between the source electrode and the drain electrode, a gate signal transmission portion disposed on the same layer as the data line and disposed adjacent to the gate pad portion, a first passivation layer disposed on the data conductor, the gate insulating layer and an exposed portion of the semiconductor layer, and an organic layer disposed on the first passivation layer. The organic layer is thicker than the first passivation layer and a thickness of the organic layer in a display area of the liquid crystal display is greater than a thickness of the organic layer disposed on an area of the liquid crystal display where the data pad portion is disposed. The organic layer, the first passivation layer and the gate insulating layer include a first pad contact hole exposing the gate pad portion. In addition, the organic layer and the first passivation layer further include a first drain contact hole that partially exposes the drain electrode, a second pad contact hole exposing the gate signal transmission pad portion, and a third pad contact hole exposing the data pad portion.

In addition, the liquid crystal display further includes a common electrode disposed on the organic layer, and the common electrode includes a second drain contact hole in an area corresponding to the drain electrode, a connection member disposed on the same layer as the common electrode and disposed on the first pad contact hole and the second pad contact hole, a second passivation layer disposed on the common electrode and the connection member and includes a third drain contact hole disposed in an area corresponding to the drain electrode. The common electrode and the second passivation layer have substantially a same planar shape as each other. A width of the first drain contact hole is smaller than a width of the second drain contact hole and a width of the third drain contact hole. The width of the second drain contact hole is greater than the width of the third drain contact hole. The second passivation layer and the common electrode are disposed in the display area of the liquid crystal display and are not disposed in a peripheral area of the liquid crystal display in which the gate pad portion and the data pad portion are disposed.

Also, the liquid crystal display further includes a pixel electrode disposed on the second passivation layer and electrically connected to the drain electrode through the first drain contact hole, the second drain contact hole and the third drain contact hole. A thickness of the pixel electrode is greater than a thickness of the common electrode.

According to the liquid crystal display and the manufacturing method thereof of exemplary embodiments of the present invention, two field generating electrodes are formed on one display panel such that an increase in manufacturing costs can be prevented.

BRIEF DESCRIPTION OF THE DRAWINGS

Exemplary embodiments of the present invention can be understood in more detail from the following detailed description when taken in conjunction with the attached drawings, in which.

DETAILED DESCRIPTION OF EXEMPLARY EMBODIMENTS

Figure 1:
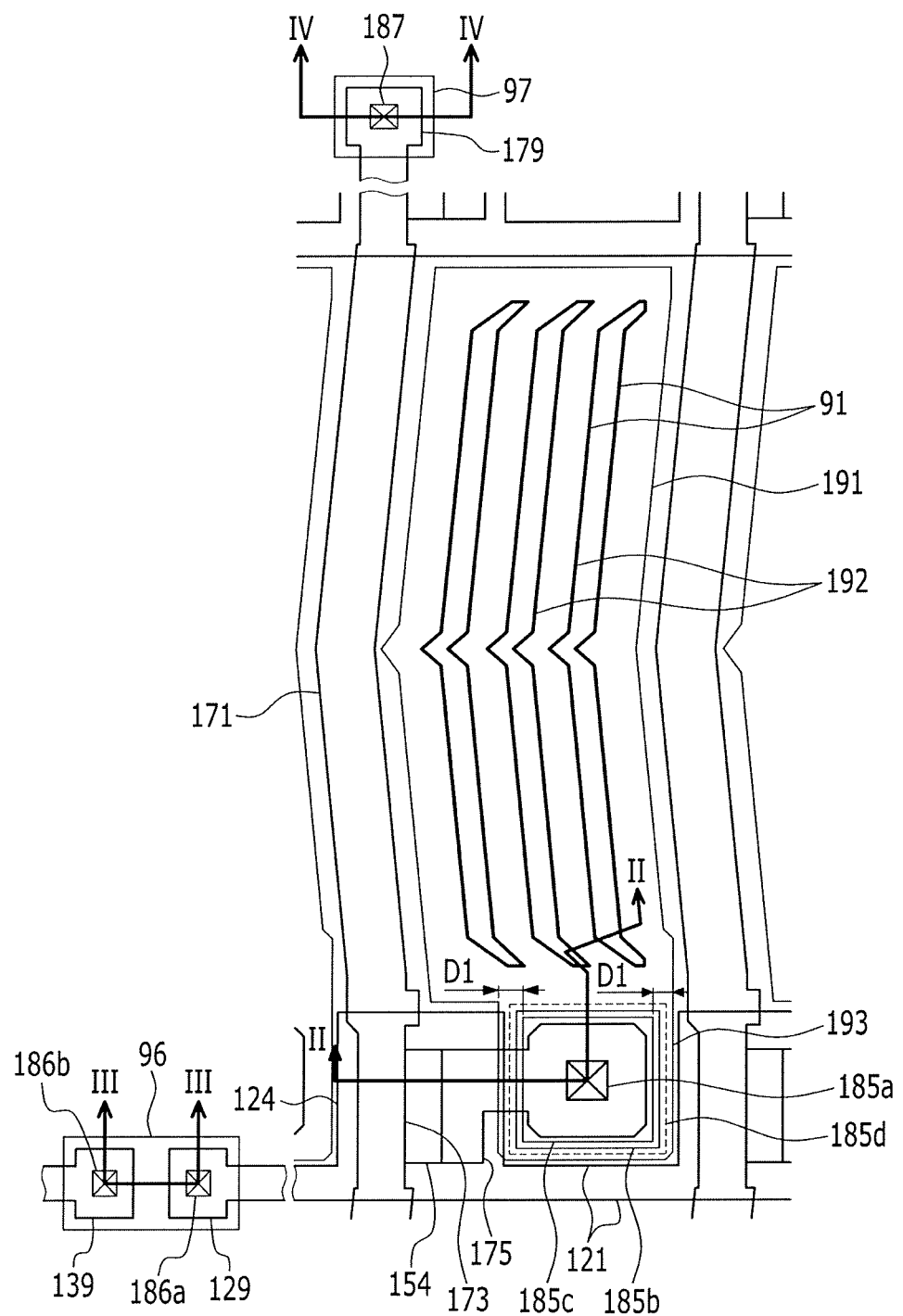
FIG. 1 is a layout view of a liquid crystal display according to an exemplary embodiment of the present invention.

Exemplary embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc. may be exaggerated for clarity. Like reference numerals designate like elements throughout the specification. It will be understood that when an element such as a layer, film, region, or substrate is referred to as being "on" another element, it can be directly on the other element or intervening elements may also be present.

As used herein, the singular forms, "a", "an", and "the" are intended to include plural forms as well, unless the context clearly indicates otherwise.

Now, a liquid crystal display according to an exemplary embodiment of the present invention will be described.

Figure 2:
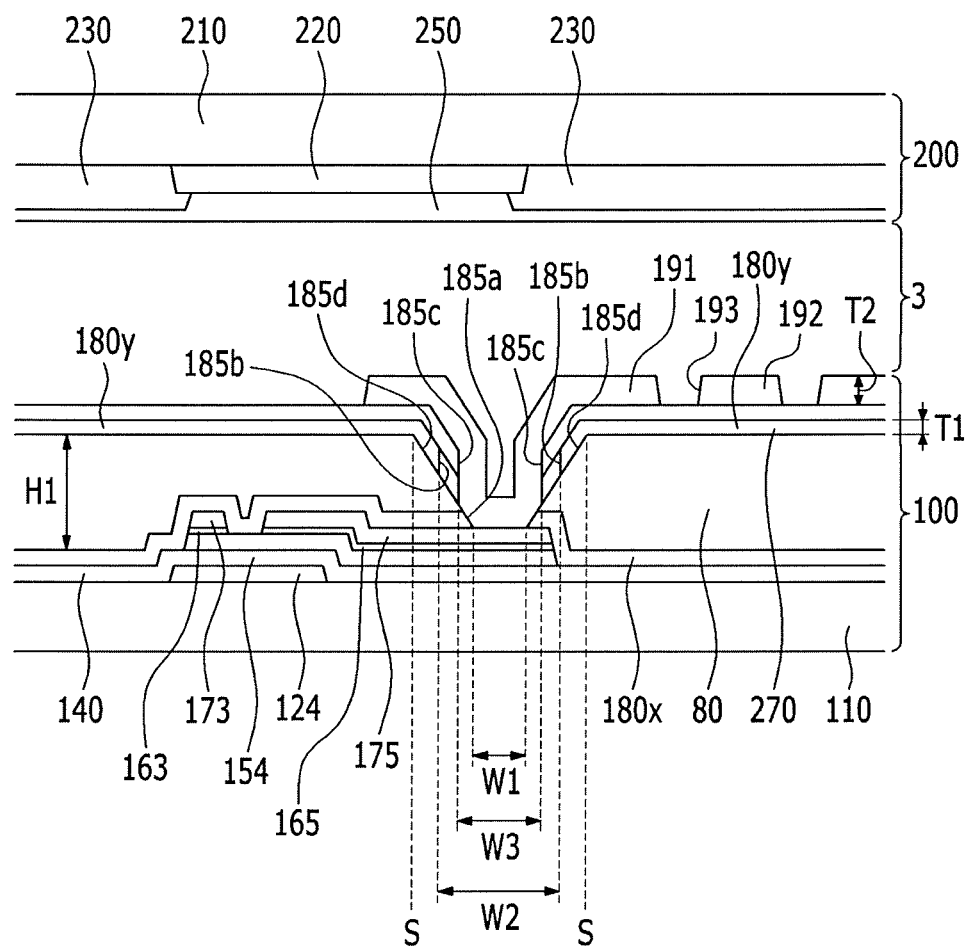
FIG. 2 is a cross-sectional view of FIG. 1, taken along the line II-II.
Figure 3:
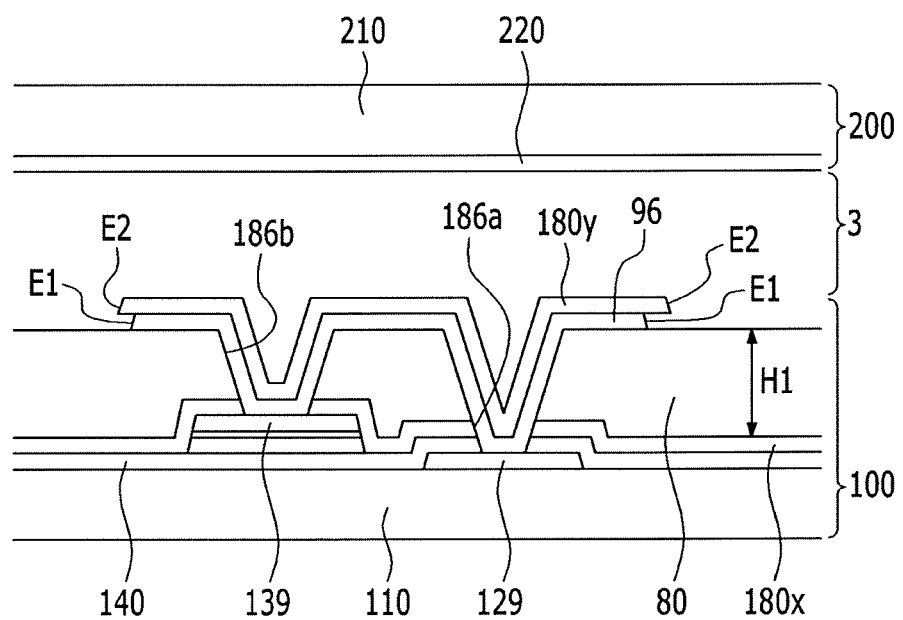
FIG. 3 is a cross-sectional view of FIG. 1, taken along the line
Figure 4:
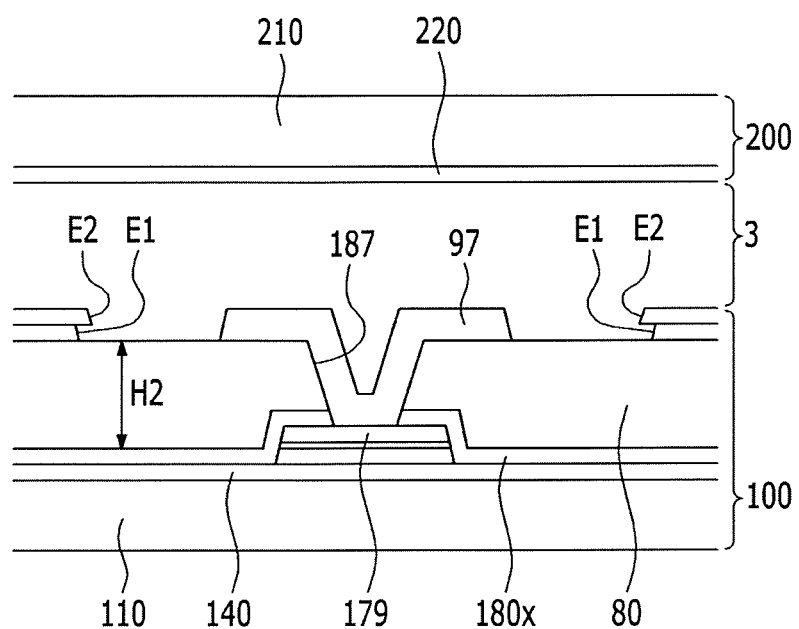
FIG. 4 is a cross-sectional view of FIG. 1, taken along the line IV-IV.

A liquid crystal display according to an exemplary embodiment of the present invention will be described with reference to FIG. 1 to FIG. 4. FIG. 1 is a layout view of a liquid crystal display according to an exemplary embodiment of the present invention, FIG. 2 is a cross-sectional view of FIG. 1, taken along the line II-II, FIG. 3 is a cross-sectional view of FIG. 1, taken along the line and FIG. 4 is a cross-sectional view of FIG. 1, taken along the line IV-IV.

Referring to FIG. 1 to FIG. 4, a liquid crystal display according to an exemplary embodiment of the present invention includes a lower panel 100 and an upper panel 200 facing each other, and a liquid crystal layer 3 injected therebetween.

First, the lower panel 100 will be described.

A gate conductor including a gate line 121 is formed on a first substrate 110 made of transparent glass, quartz, or plastic. Further, in an exemplary embodiment, the first substrate 110 may be, for example, a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

The gate line 121 includes, for example, a wide gate pad portion 129 for connection with a gate electrode 124 and another layer or an external driving circuit. For example, the gate line 121 is made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti). However, the gate line 121 may have, for example, a multilayer structure including at least two insulating layers having different physical properties.

A gate insulating layer 140 made of, for example, a silicon nitride (SiNx), a silicon oxide (SiOx), silicon oxynitride (SiOxNy), aluminum oxide (AlOx), yttrium oxide ($Y_2O_3$), hafnium oxide (HfOx), zirconium oxide (ZrOx), aluminum nitride (AlN), aluminum oxynitride (AlNO), titanium oxide (TiOx), barium titanate (BaTiO3), lead titanate (PbTiO3), or a combination thereof is formed on the gate conductors 121, 124, and 129. The gate insulating layer 140 may have, for example, a multilayer structure including at least two insulating layers having different physical properties.

A semiconductor 154 made of, for example, amorphous silicon, polysilicon, or the like is formed on the gate insulating layer 140. The semiconductor 154 may include, for example, an oxide semiconductor. For example, the oxide semiconductor can be made of an oxide material including indium, zinc, tin, gallium, lead, germanium, cadmium, or an oxide compound thereof, such as indium gallium zinc oxide, indium zinc oxide and zinc tin oxide, but exemplary embodiments are not limited thereto.

Ohmic contacts 163 and 165 are positioned on the semiconductor 154. The ohmic contacts 163 and 165 may be made of a material such as, for example, n+ hydrogenated amorphous silicon in which an n-type impurity such as phosphorus is doped at a high concentration, or of a silicide. The ohmic contacts 163 and 165 may be disposed on the semiconductor 154 as a pair. In the case that the semiconductor 154 is an oxide semiconductor, the ohmic contacts 163 and 165 may be omitted.

A data conductor including a data line 171 including a source electrode 173 and a drain electrode 175 is positioned on the ohmic contacts 163 and 165 and the gate insulating layer 140.

The data line 171 includes, for example, a data pad portion 179 for connection with another layer or an external driving circuit. The data line 171 transfers a data signal, and mainly extends, for example, in a vertical direction to cross the gate line 121.

In this case, the data line 171 may have, for example, a first curved portion having a curved shape to acquire maximum transmittance of the liquid crystal display, and the curved portion may have a V-letter shape which meets in a middle region of the pixel area. In addition, the data line 171 may further include, for example, a second curved portion which is curved to form a predetermined angle with the first curved portion may be further included in the middle region of the pixel area.

The source electrode 173 is a part of the data line 171, and is disposed on the same line as the data line 171. The drain electrode 175 is formed to extend, for example, in parallel with the source electrode 173. Accordingly, the drain electrode 175 is parallel with part of the data line 171.

The gate electrode 124, the source electrode 173, and the drain electrode 175 form one thin film transistor (TFT) together with the semiconductor 154, and a channel of the thin film transistor is positioned in the semiconductor 154 between the source electrode 173 and the drain electrode 175.

The liquid crystal display according to the present exemplary embodiment of the present invention includes the source electrode 173 positioned on the same line with the data line 171 and the drain electrode 175 extending in parallel with the data line 171, and as a result, a width of the thin film transistor may be increased while an area occupied by the data conductor is not increased to thereby increase an aperture ratio of the liquid crystal display.

However, in case of a liquid crystal display according to an exemplary embodiment of the present invention, the source electrode 173 and the drain electrode 175 may have different shapes.

The data line 171 and the drain electrode 175 may be made of a refractory metal such as, for example, molybdenum, chromium, tantalum, and titanium, or an alloy thereof, and may have a multilayered structure including a refractory metal layer and a low resistive conductive layer. Examples of the multilayered structure may include but are not limited to a double layer of a chromium or molybdenum (alloy) lower layer and an aluminum (alloy) upper layer, and a triple layer of a molybdenum (alloy) lower layer, an aluminum (alloy) middle layer, and a molybdenum (alloy) upper layer. However, the data line 171 and the drain electrode 175 may be formed of various other metals or conductors.

A gate signal transmission pad portion 139 formed on the same layer as that of the data line 171 is formed in a portion that is adjacent to the gate pad portion 129.

The gate signal transmission pad portion 139 transmits a gate signal to the gate line 121 from the gate driver through the gate pad portion 129.

A first passivation layer 180x is positioned on the data conductor, the gate insulating layer 140, and an exposed portion of the semiconductor 154. The first passivation layer 180x may be made of, for example, an organic insulating material or an inorganic insulating material.

An organic layer 80 is disposed on the first passivation layer 180x. The thickness of the organic layer 80 is greater than the thickness of the first passivation layer 180x, and the organic layer 80 may have a flat surface.

A first thickness H1 of the organic layer 80 located in a display area where a plurality of pixels are disposed for displaying an image may be greater than a second thickness H2 of the organic layer 80 located in an area where the data pad portion 179 is disposed.

Alternatively, in an exemplary embodiment of the present invention, the organic layer 80 may be omitted. In a liquid crystal display according to an exemplary embodiment, the organic layer 80 may be, for example, a color filter, and in this case, a layer disposed on the organic layer 80 may be further included. For example, a capping layer may be further disposed on the color filter to prevent permeation of a pigment of the color filter into a liquid crystal layer, and the capping layer may be made of an insulation material such as a silicon nitride (SiNx).

The organic layer 80 and the first passivation layer 180x include, for example, a first drain contact hole 185*a* that partially exposes the drain electrode 175. The organic layer 80, the first passivation layer 180x, and the gate insulating layer 140 include, for example, a first pad contact hole 186*a* exposing the gate pad portion 129, and the organic layer 80 and the first passivation layer 180x include a second pad contact hole 186*b* exposing the gate signal transmission pad portion 139. In addition, the organic layer 80 and the first passivation layer 180x include, for example, a third pad contact hole 187 exposing the data pad portion 179.

A common electrode 270 is formed on the organic layer 80. The common electrode 270 having a planar shape may be formed, for example, on the entire surface of the insulation substrate 110 as a whole plate, and includes a second drain contact hole 185*b* formed in an area corresponding to the periphery of the drain electrode 175.

Common electrodes 270 which are disposed in adjacent pixels are connected to each other so that a common voltage having a predetermined magnitude supplied from outside of the display area is transmitted thereto.

A connection member 96 is formed on the first pad contact hole 186*a* and the second pad contact hole 186*b* that expose the gate pad portion 129 and the gate signal transmission pad portion 139.

The connection member 96 connects the gate pad portion 129 and the gate signal transmission pad portion 139 that are exposed by the first pad contact hole 186*a* and the second pad contact hole 186*b* to each other so as to transmit the gate signal transmitted to the gate signal transmission pad portion 139 to the gate pad portion 129, thereby transmitting the gate signal to the gate line 121 connected to the gate pad portion 129.

The connection member 96 is formed at, for example, the same layer as the common electrode 270. The common electrode 270 and the connection member 96 are made of, for example, transparent conductive layers such as indium tin oxide (ITO), indium zinc oxide (IZO), aluminum zinc oxide (AZO), cadmium tin oxide (CTO), or a combination thereof.

A second passivation layer 180y is formed on the common electrode 270 and the connection member 96.

The second passivation layer 180y may be made of, for example, an organic insulating material or an inorganic insulating material.

The second passivation layer 180y includes, for example, a third drain contact hole 185*c* formed in an area corresponding to the drain electrode 175.

The common electrode 270 and the second passivation layer 180y have almost the same plane shape. In further detail, viewed from the top of the liquid crystal display, the shape formed by the edge of the common electrode 270 and the shape formed by the edge of the second passivation layer 180y are almost equivalent to each other.

The size and the width of the second drain contact hole 185*b* of the common electrode 270 are greater than the size and the width of the third drain contact hole 185*c* of the second passivation layer 180y.

A second edge E2 of the second passivation layer 180y is protruded more than a first edge E1 of the common electrode 270. In further detail, viewed from the top of the liquid crystal display, the second edge E2 of the second passivation layer 180y is expanded more from the first edge E1 of the common electrode 270.

The second passivation layer 180y and the common electrode 270 are disposed in the display area where the plurality of pixels are disposed, and may not be disposed in the peripheral area where the gate pad portion 129 and the data pad portion 179 are disposed.

In the present exemplary embodiment, the connection member 96 formed on the gate pad portion 129 and the gate signal transmission pad portion 139 is formed on the same layer as that of the common electrode 270, but, like a contact auxiliary member 97, the connection member 96 may be formed on the same layer as that of a pixel electrode 191.

The pixel electrode 191 is formed on the second passivation layer 180y. The pixel electrode 191 includes, for example, a curved edge that is almost parallel with a first curved portion and a second curved portion of the data line 171. The pixel electrode 191 includes, for example, a plurality of cutouts 91 and a plurality of branch electrodes 192 respectively defined by the plurality of cutouts 91.

The pixel electrode 191 includes, for example, an expansion portion 193 expanded toward the drain electrode 175, and the expansion portion 193 of the pixel electrode 191 is physically and electrically connected with the drain electrode 175 through the first drain contact hole 185a, the second drain contact hole 185b, and the third drain contact hole 185c to receive a data voltage from the drain electrode 175.

The contact auxiliary member 97 is formed on the data pad portion 179 exposed by the third pad contact hole 187. The contact auxiliary member 97 supplements adhesion between the data pad portion 179 and an external device and protects them.

The pixel electrode 191 and the contact auxiliary members 97 are made of transparent conductive layers such as indium tin oxide (ITO), indium zinc oxide (IZO), aluminum zinc oxide (AZO), cadmium tin oxide (CTO), or a combination thereof. The pixel electrode 191 and the contact auxiliary members 97 are thicker than the common electrode 270 and the connection member 96. In further detail, a fourth thickness T2 of the pixel electrode 191 is greater than a third thickness T1 of the common electrode 270, and the fourth thickness T2 may be about two times or more the third thickness T1. For example, the pixel electrode 191 and the contact auxiliary members 97 may have a thickness of about 900 Å.

In addition, a first alignment layer is coated on the pixel electrode 191 and the first passivation layer 180y that is not covered by the pixel electrode 191, and the first alignment layer may be a horizontal alignment layer rubbed in a predetermined direction. However, alternatively in an exemplary embodiment of the present invention, the first alignment layer may instead include a photoactive material and thus may be photo-aligned.

Now, the upper panel 200 will be described.

A light blocking member 220 is formed on a second substrate 210 made of, for example, transparent glass, quartz, or plastic. Further, in an exemplary embodiment, the second substrate 210 may be, for example, a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

The light blocking member 220 is also called a black matrix, and blocks light leakage.

In addition, a plurality of color filters 230 are formed on the second substrate 210.

An overcoat 250 is formed on the color filter 230 and the light blocking member 220. The overcoat 250 may be made of, for example, an (organic) insulation material, and prevents the color filters 230 from being exposed and provides a flat surface. The overcoat 250 may be omitted.

Also, a second alignment layer is coated on the overcoat 250, and the second alignment layer may be, for example, a vertical alignment layer rubbed in a predetermined direction. However, alternatively in an exemplary embodiment of the present invention, the second alignment layer may instead include a photoactive material and thus may be photo-aligned.

The liquid crystal layer 3 includes, for example, a nematic liquid crystal material having positive dielectric anisotropy. The long-axial direction of liquid crystal molecules of the liquid crystal layer 3 may be arranged, for example, in parallel with the display panels 100 and 200.

The pixel electrode 191 receives the data voltage from the drain electrode 175, and the common electrode 270 receives a common voltage having a predetermined magnitude from a common voltage applying portion disposed outside of the display area.

The pixel electrode 191, which is a field generating electrode, and the common electrode 270 generate an electric field such that the liquid crystal molecules of the liquid crystal layer 3 disposed on the pixel electrode 191 and the common electrode 270 rotate in a direction that is parallel with a direction of the electric field. As described above, according to the determined rotation direction of the liquid crystal molecules, polarization of light passing through the liquid crystal layer 3 is changed.

The common electrode 270 and the second passivation layer 180y formed on the common electrodes 270 have substantially the same plane form as each other. Thus, the second passivation layer 180y and the common electrode 270 may be formed together using one photomask.

Accordingly, an increase in the manufacturing cost for the liquid crystal display can be prevented.

Now, the drain contact portion of the liquid crystal display according to the present exemplary embodiment of the present invention will be described in further detail.

The organic layer 80, the first passivation layer 180x, and the gate insulating layer 140 include the first drain contact hole 185a, the common electrode 270 includes the second drain contact hole 185b, and the second passivation layer 180y includes the third drain contact hole 185c.

The first drain contact hole 185a, the second drain contact hole 185b, and the third drain contact hole 185c at least partially overlap each other.

The drain electrode 175 exposed through the overlapped portion is connected with the pixel electrode 191.

A first size and a first width W1 of the first drain contact hole 185a are smaller than a second size and a second width W2 of the second drain contact hole 185a and a third size and a third width W3 of the third drain contact hole 185c. In addition, the second size and the second width W2 of the second drain contact hole 185a are greater than the third size and the third width W3 of the third drain contact hole 185c. That is, the sizes and the widths of the first drain contact hole 185a, the third drain contact hole 185c, and the second drain contact hole 185b are increased in that order.

As the second size and the second width W2 of the common electrode 270 formed in the second drain contact hole 185b are greater than the third size and the third width W3 of the third drain contact hole 185c formed in the second passivation layer 180y, the second edge E2 of the second passivation layer 180y protrudes more than the first edge E1 of the common electrode 270. Thus, the pixel electrode 191 formed above the second passivation layer 180y can be prevented from being connected with the common electrode 270 formed below the second passivation layer 180y.

Referring to FIG. 1, the size and the width of an edge 185d of an inclined portion where the first drain contact hole 185a is formed are wider than the second size and the second width W2 of the second drain contact hole 185a and the third size and the third width W3 of the third drain contact hole 185c.

That is, the second drain contact hole 185a of the common electrode 270 and the third drain contact hole 185c of the second passivation layer 180y are disposed in an inclined portion S of the first drain contact hole 185a formed in the organic layer 80. Accordingly, a cutting of the pixel electrode 191 due to a step difference formed in a contact portion by the third drain contact hole 185c protruded more than the second drain contact hole 185b can be prevented. In addition, as previously described, a fourth thickness T2 of the pixel electrode 191 is about two times that of a third thickness T1 of the common electrode 270, and therefore a cutting of the pixel 191 due to a step difference formed in a contact portion by the third drain contact hole 185c that is protruded more than the second drain contact hole 185b can be prevented.

As the fourth thickness T2 of the pixel electrode 191 is thick, a distance D1 between the third drain contact hole 185c and an edge of the expansion portion 193 of the pixel electrode 191 is almost equal to the fourth thickness T2 of the pixel electrode 191.

As described, in the liquid crystal display according to the present exemplary embodiment of the present invention, the second passivation layer 180y and the common electrode 270 are formed together using one photomask, and thus an increase in the manufacturing costs of the liquid crystal display can be prevented and a cutting of the pixel electrode 191 due to a step difference of the second passivation layer 180y and the common electrode 270 in the drain contact portion can be prevented.

Figure 5:
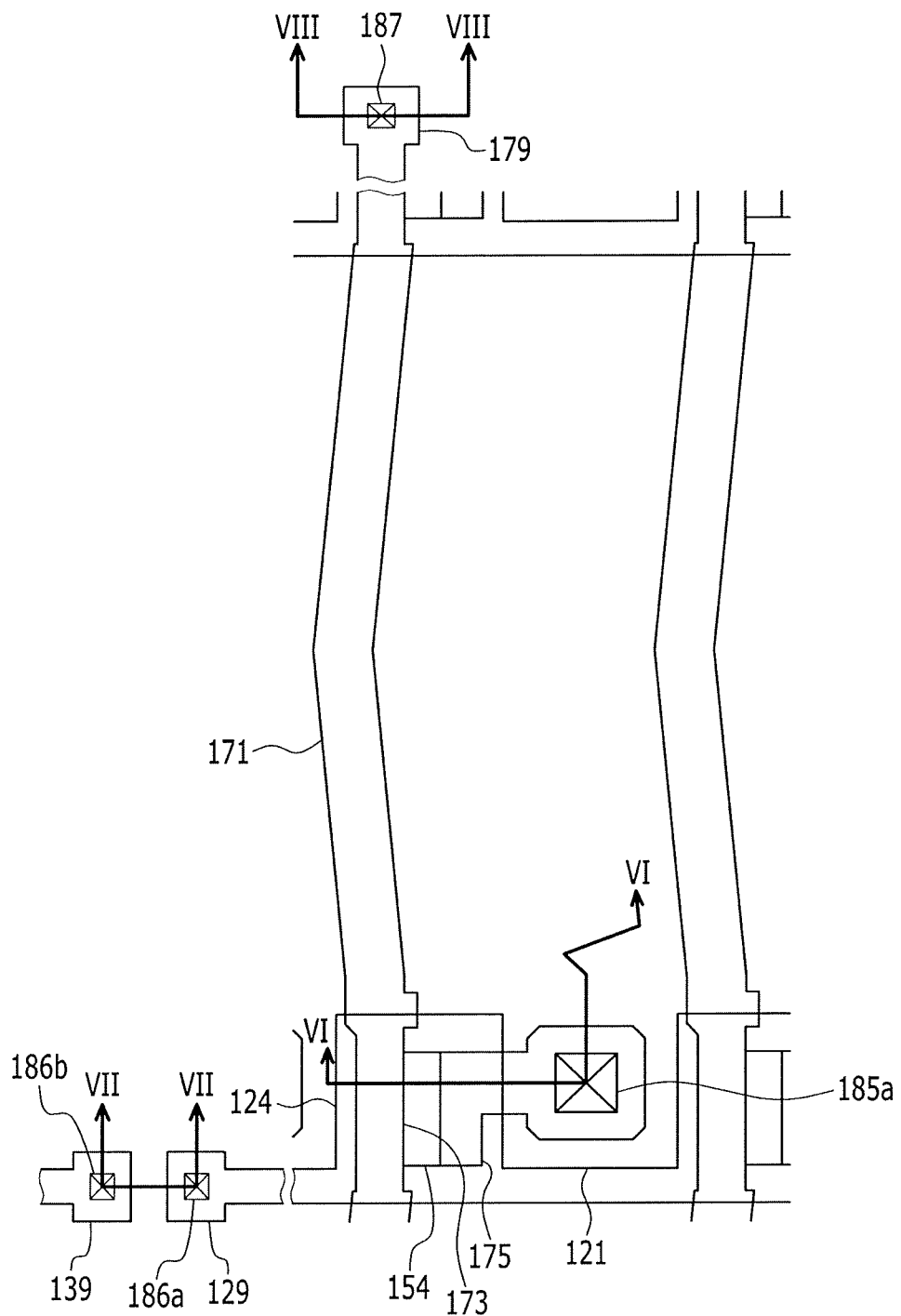
FIG. 5 is a layout view of a manufacturing process of a liquid crystal display according to an exemplary embodiment of the present invention.
Figure 6:
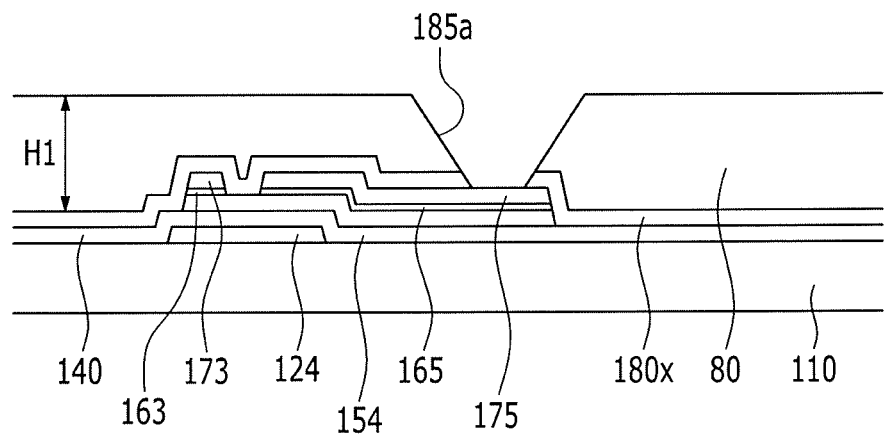
FIG. 6 is a cross-sectional view of the manufacturing process of the liquid crystal display of FIG. 5, taken along the line of VI-VI.
Figure 7:
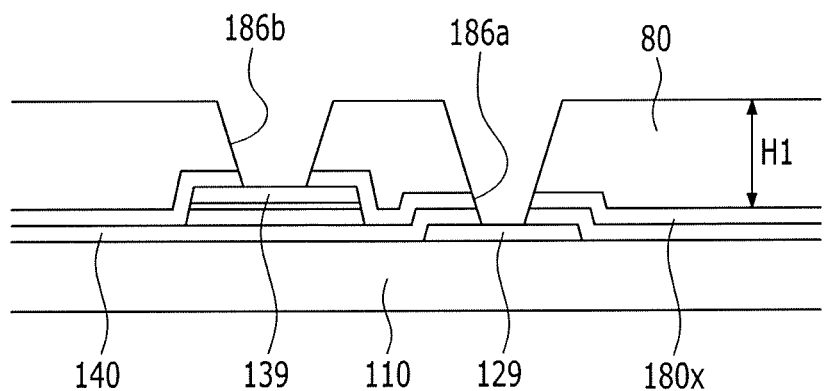
FIG. 7 is a cross-sectional view of the manufacturing process of the liquid crystal display, taken along the line VII-VII of FIG. 5.
Figure 8:
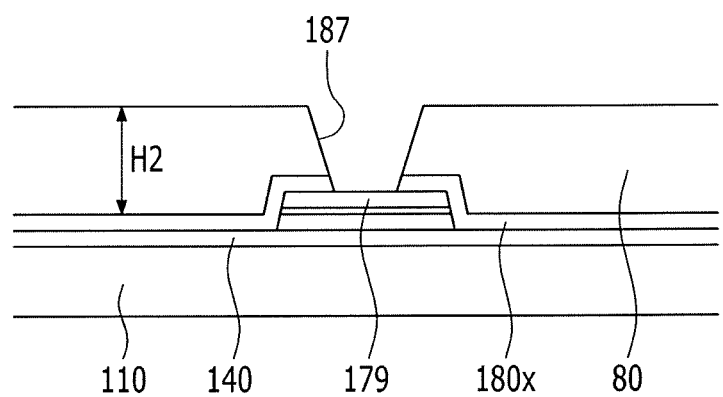
FIG. 8 is a cross-sectional view of the manufacturing process of the liquid crystal display taken along the line VIII-VIII of FIG. 5.
Figure 9:
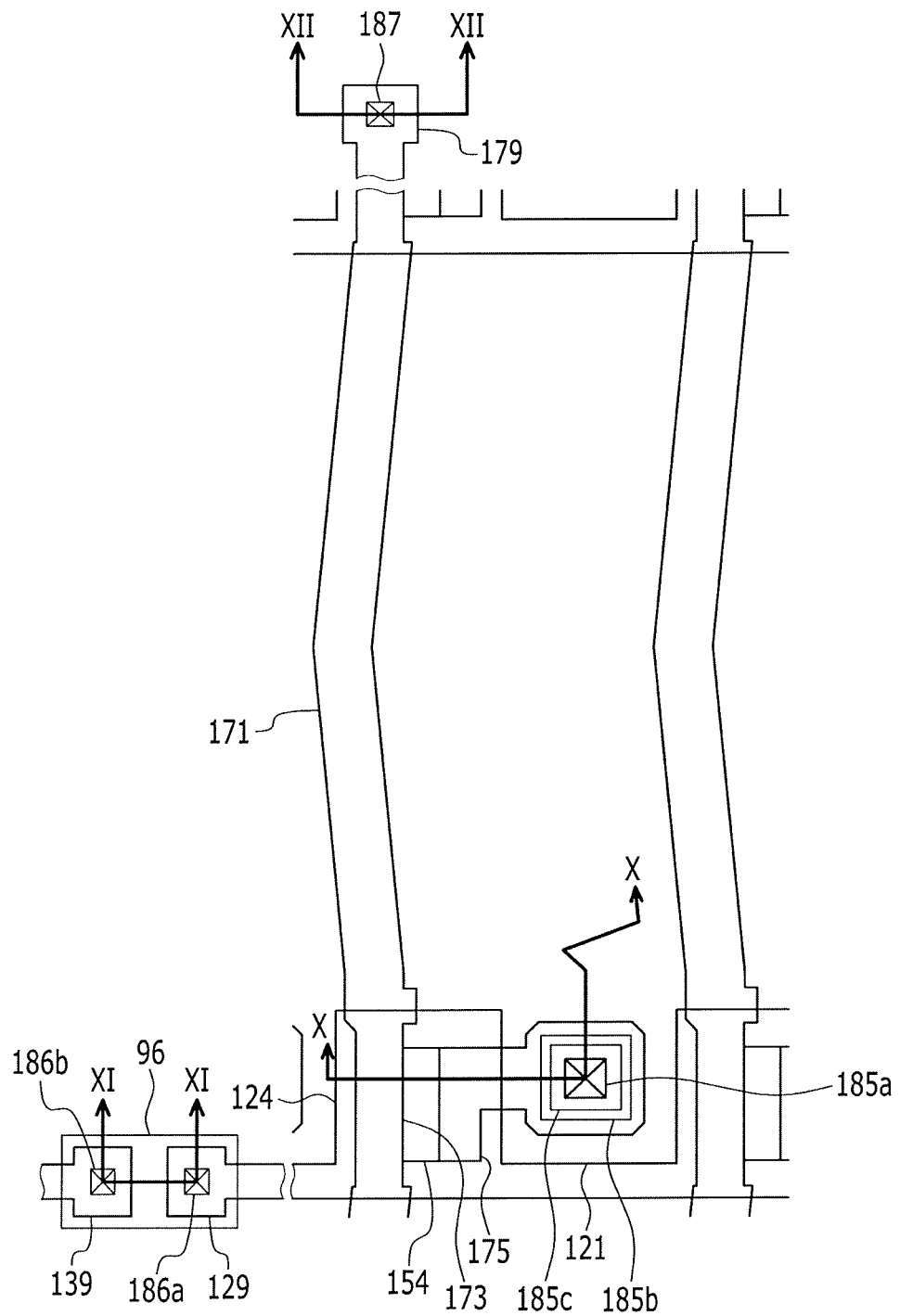
FIG. 9 is a layout view of a manufacturing process of a liquid crystal display according to an exemplary embodiment of the present invention.
Figure 10:
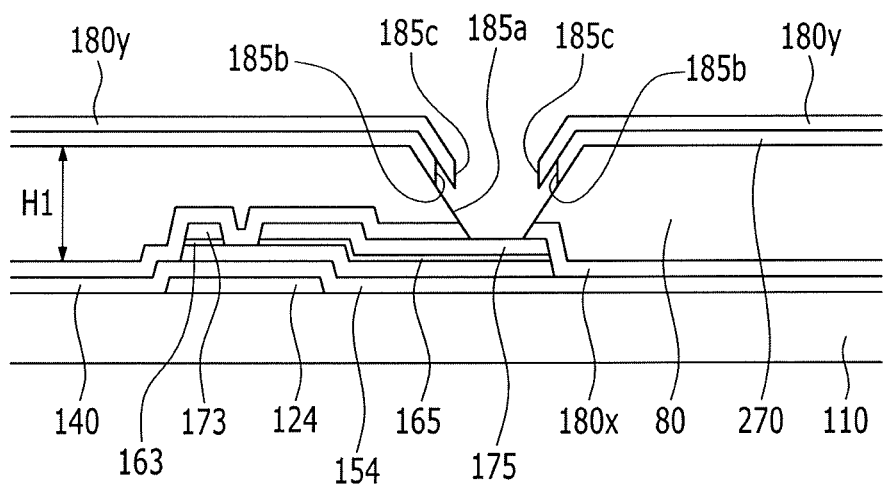
FIG. 10 is a cross-sectional view of the manufacturing process of the liquid crystal display taken along the line X-X of FIG. 9.
Figure 11:
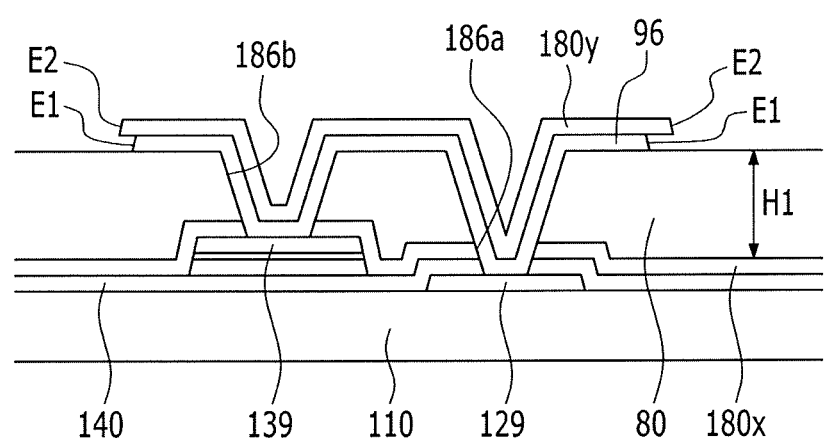
FIG. 11 is a cross-sectional view of the manufacturing process of the liquid crystal display taken along the line XI-XI of FIG. 9.
Figure 12:
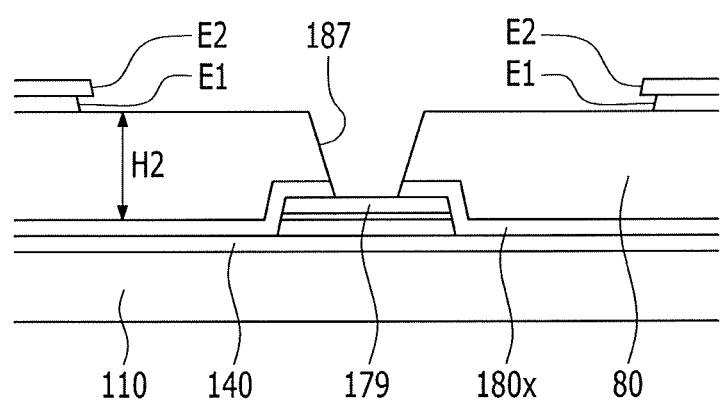
FIG. 12 is a cross-sectional view of the manufacturing process of the liquid crystal display taken along the line XII-XII of FIG. 9.

Now, a manufacturing method of a liquid crystal display according to an exemplary embodiment of the present invention will be described with reference to FIG. 5 to FIG. 27, together with FIG. 1 to FIG. 4. FIG. 5 is a layout view of a manufacturing process of a liquid crystal display according to an exemplary embodiment of the present invention. FIG. 6 is a cross-sectional view of the manufacturing process of the liquid crystal display taken along the line VI-VI of FIG. 5. FIG. 7 is a cross-sectional view of the manufacturing process of the liquid crystal display taken along the line VII-VII of FIG. 5. FIG. 8 is a cross-sectional view of the manufacturing process of the liquid crystal display taken along the line VIII-VIII of FIG. 5. FIG. 9 is a layout view of a manufacturing process of the liquid crystal display according to an exemplary embodiment of the present invention. FIG. 10 is a cross-sectional view of the manufacturing process of the liquid crystal display taken along the line X-X of FIG. 9. FIG. 11 is a cross-sectional view of the manufacturing process of the liquid crystal display taken along the line XI-XI of FIG. 9. FIG. 12 is a cross-sectional view of the manufacturing process taken along the line XII-XII of FIG. 9. FIG. 13 to FIG. 27 are cross-sectional views that sequentially illustrate a manufacturing process of a liquid crystal display according to an exemplary embodiment of the present invention.

Referring to FIG. 5 to FIG. 8, the gate line 121 including the gate electrode 124 and the gate pad portion 129 is formed on the first substrate 110, and the gate insulation layer 140 is formed on the gate line 121. The semiconductor 154, the ohmic contacts 163 and 165, the data line 171 including the source electrode 173 and the data pad portion 179, the drain electrode 175, and the gate signal transmission pad portion 139 are formed on the gate insulating layer 140. The first passivation layer 180x and the organic layer 80 are formed on the first substrate 110 where the data line 171, the drain electrode 175, and the gate signal transmission pad portion 139 are formed. The organic layer 80 is not formed in a position where the first drain contact hole 185a, the first pad contact hole 186a, the second pad contact hole 186b, and the third pad contact hole 187 are formed.

The organic layer 80 may be, for example, a color filter, and a light blocking member may be formed together therewith. Here, a first thickness H1 of the organic layer 80 located in the display area where the plurality of pixels are disposed to display an image may be greater than a second thickness H2 of the organic layer 80 located in the peripheral area where the data pad portion 179 is formed. In addition, the organic layer 80 may be omitted.

The first drain contact hole 185a exposing the drain electrode 175, the gate pad portion 129, the gate signal transmission pad portion 139, the first drain contact hole 185a exposing the data pad portion 179, the first pad contact hole 186a, the second pad contact hole 186b, and the third pad contact hole 187 are formed by etching the first passivation layer 180x disposed in an area that is not covered by the organic layer 80 and the gate insulating layer 140.

Next, as shown in FIG. 9 to FIG. 12, the common electrode 270, the connection member 96, and the second passivation layer 180y are formed together. As previously described, the common electrode 270 and the second passivation layer 180y are formed together such that the shape formed by and edge of the common electrode 270 and an edge of the second passivation layer 180y are substantially equal to each other, and the second edge E2 of the second passivation layer 180y is formed to have a shape that is extended more than the first edge E1 of the common electrode 270.

Now, a method for forming the common electrode 270, the connection member 96, and the second passivation layer 180y together will be described with reference to FIG. 13 to FIG. 27.

Figure 13:
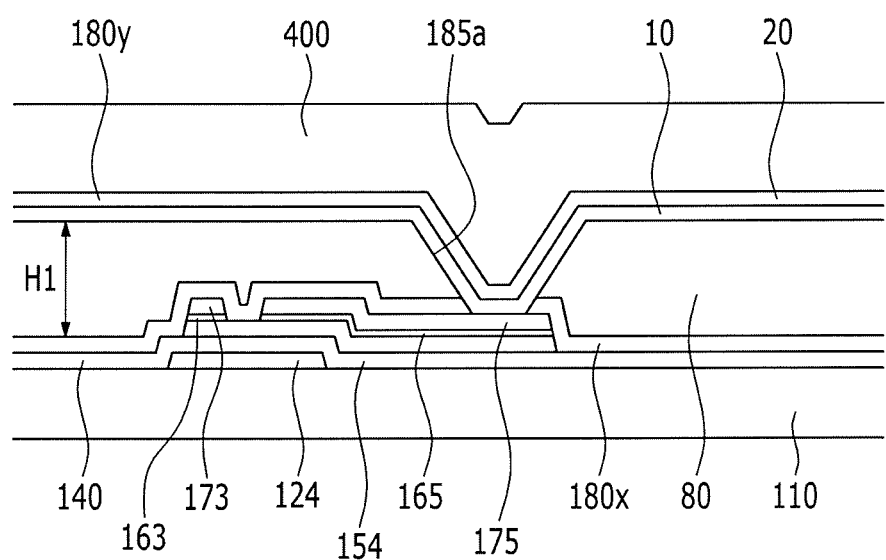
FIG. 13 to FIG. 27 are cross-sectional views that sequentially illustrate a manufacturing process of a liquid crystal display according to an exemplary embodiment of the present invention.
Figure 14:
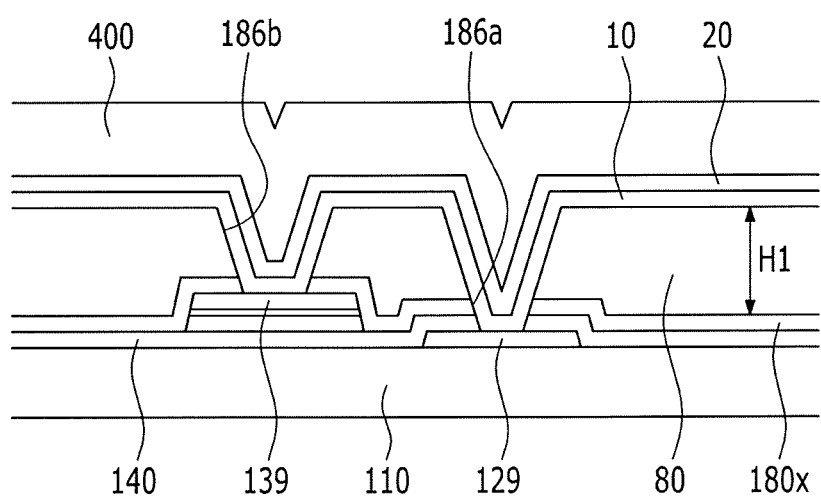
Figure 15:
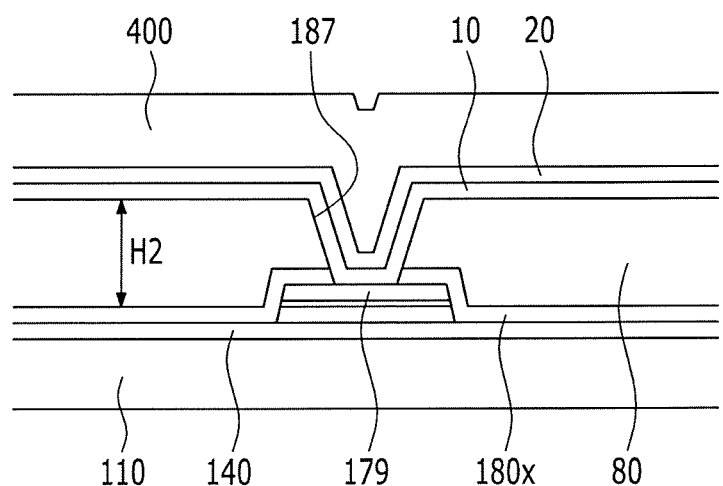

Referring to FIG. 13 to FIG. 15, a first layer 10 made of a transparent conductive layer is deposited to the first substrate 110 where the first drain contact hole 185a, the first pad contact hole 186a, the second pad contact hole 186b, and the third pad contact hole 187 are formed, and a second layer 20 made of an insulation layer is deposited on the first layer 10. After that, a photosensitive film 400 is layered on the second layer 20.

Figure 16:
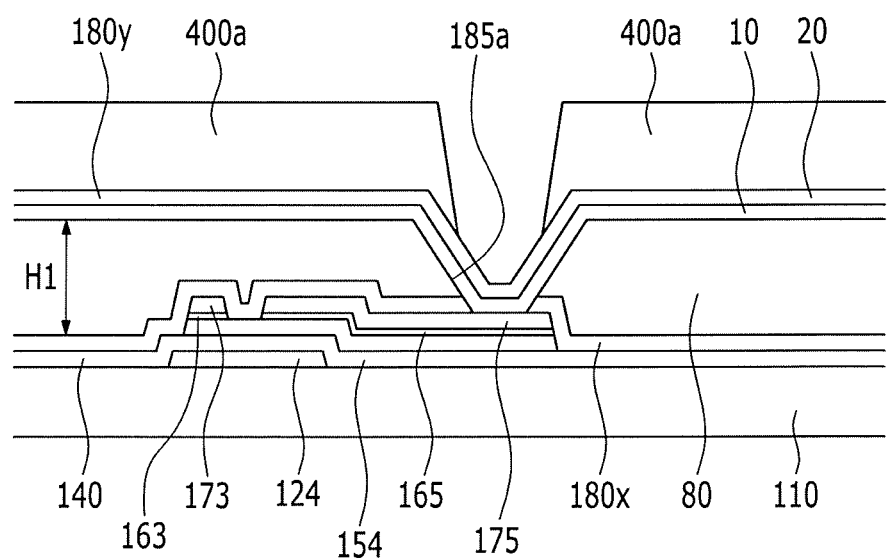
Figure 17:
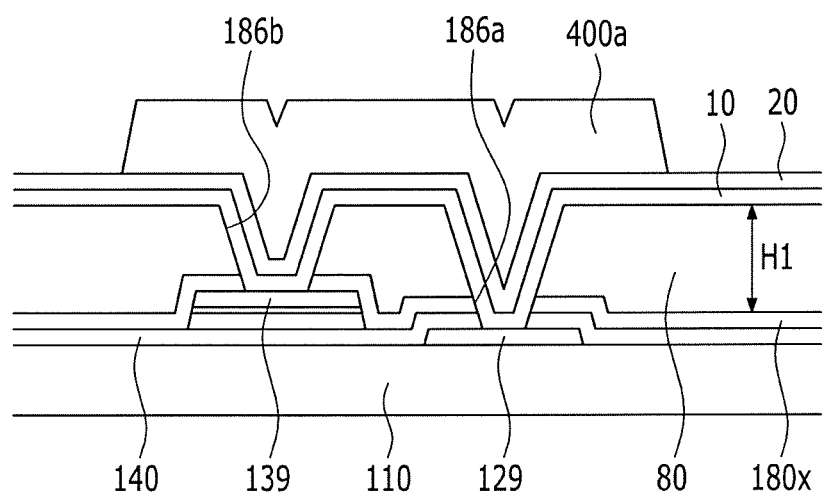
Figure 18:
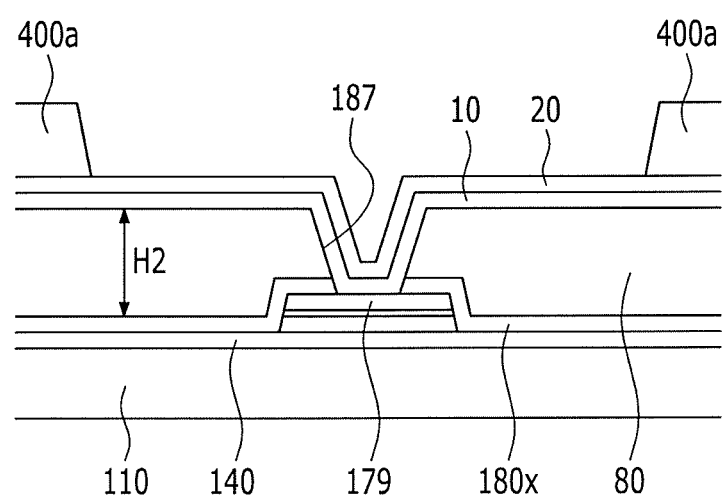

Referring to FIG. 16 to FIG. 18, a photosensitive film pattern 400a is formed by, for example, printing and developing the photosensitive film 400. In this case, the photosensitive film pattern 400a is formed in an area corresponding to a location where the second passivation layer 180y is formed as a whole.

Figure 19:
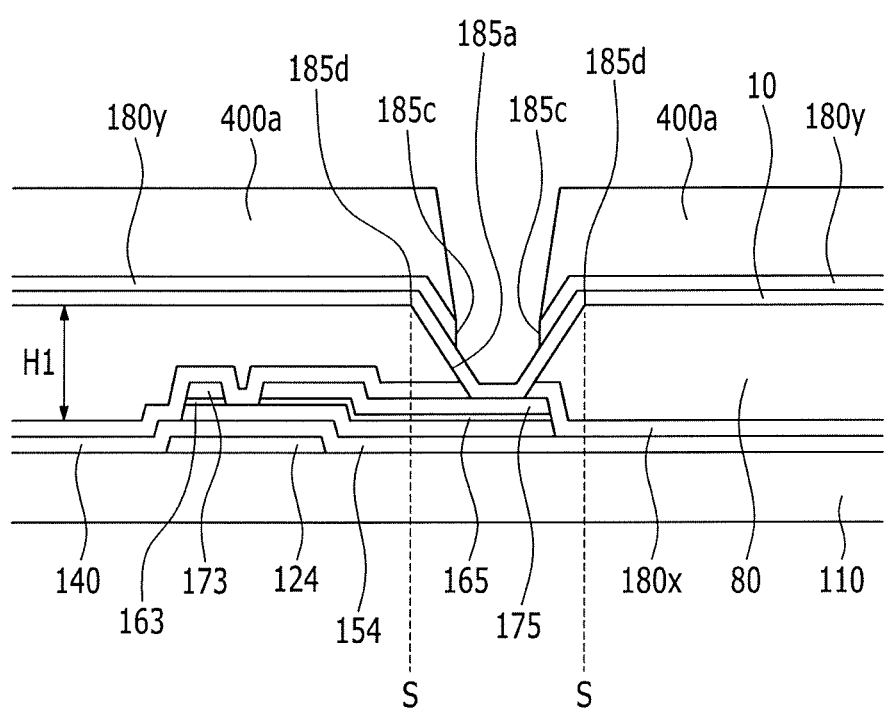
Figure 20:
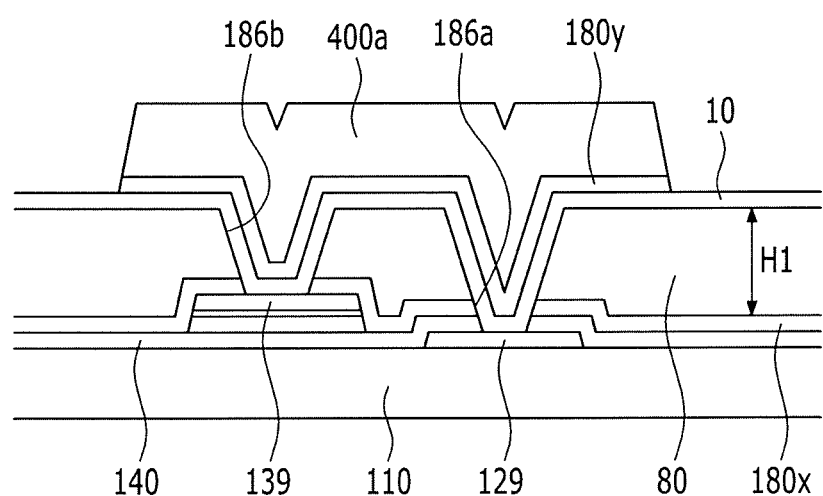
Figure 21:
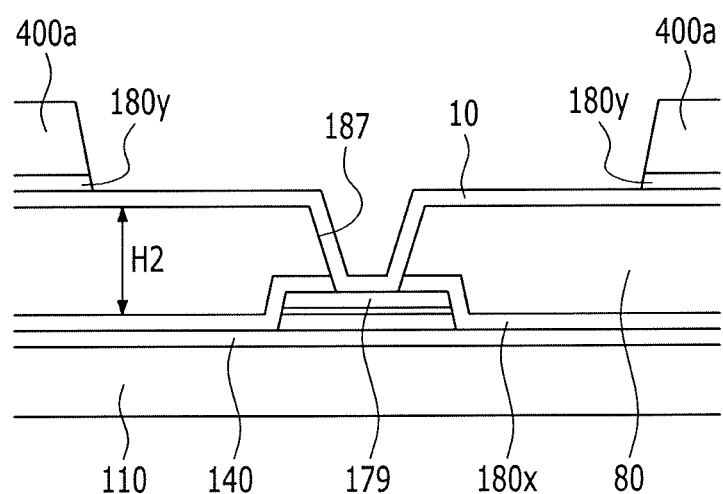

Referring to FIG. 19 to FIG. 21, the second layer 20 is, for example, dry-etched by using the photosensitive film pattern 400a as an etching mask so as to form the second passivation layer 180y. The third drain contact hole 185c is formed in the second passivation layer 180y, and the second passivation layer 180y has the second edge E2.

Figure 22:
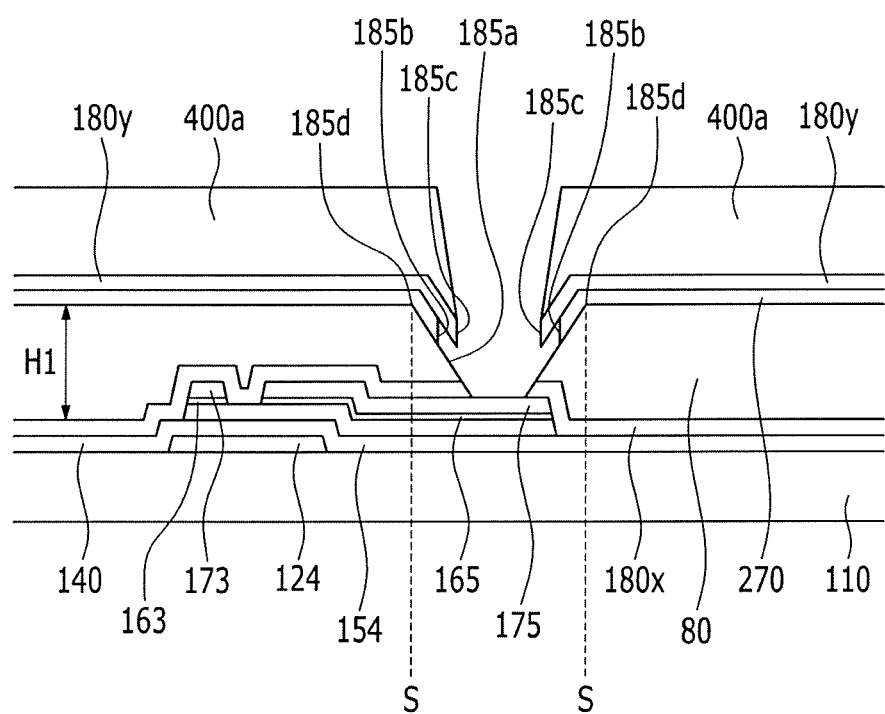
Figure 23:
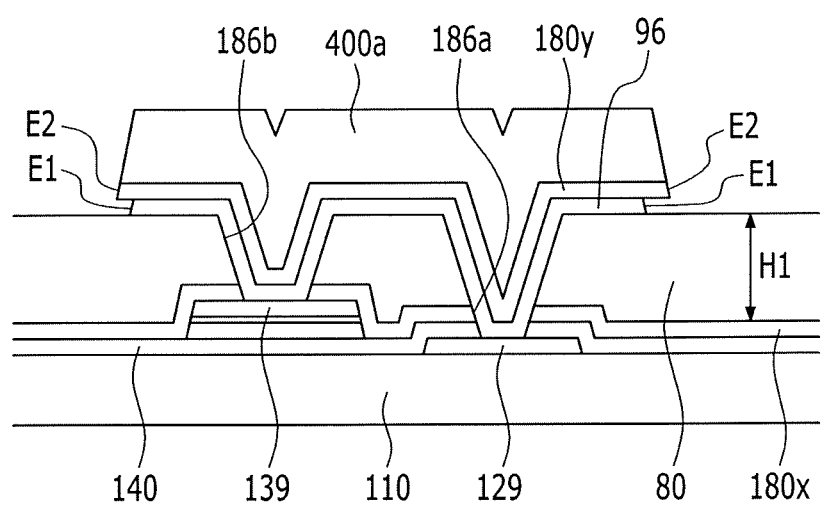
Figure 24:
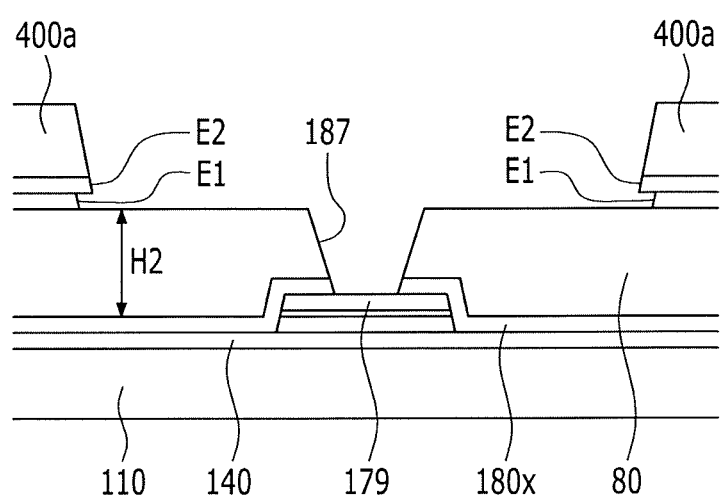
Figure 25:
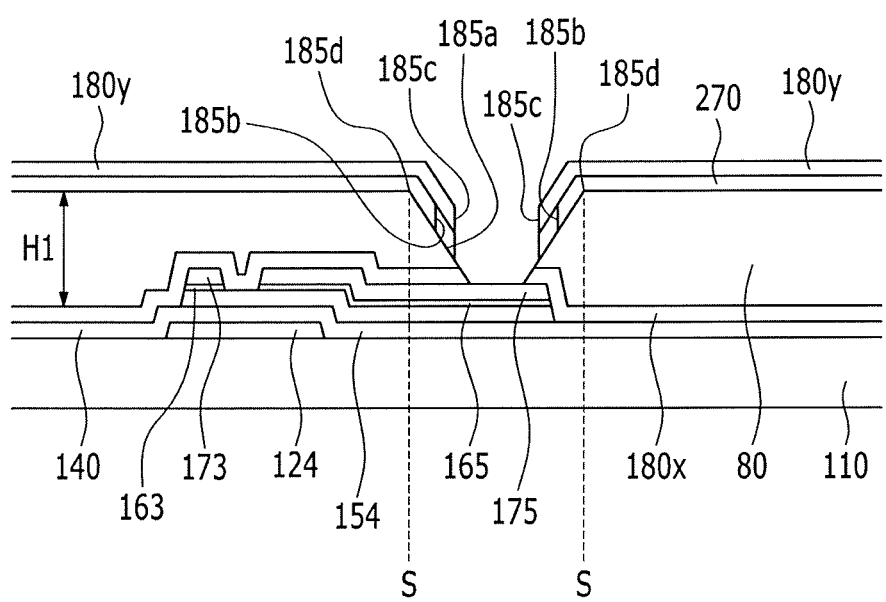
Figure 26:
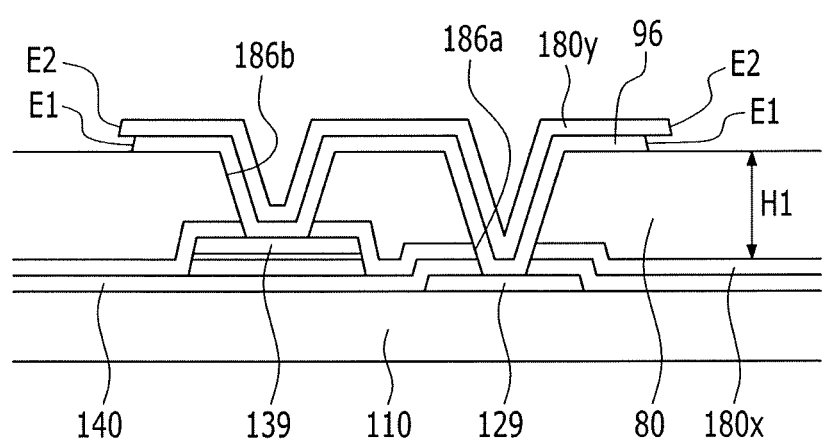
Figure 27:
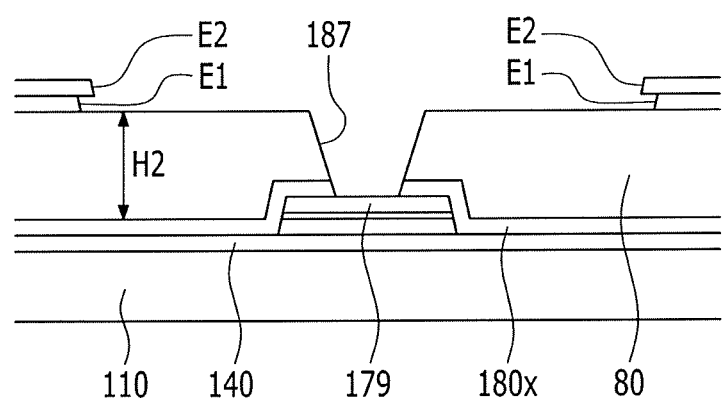

Next, as shown in FIG. 22 to FIG. 24, the first layer 10 is, for example, wet-etched by using the photosensitive film pattern 400a as an etching mask, but it is over-etched so as to form the common electrode 270 having the first edge E1 that is less extended than the second edge E2 of the second passivation layer 180y and the connection member 96. In this case, the second drain contact hole 185b of which the size and the width are greater than the size and width of the third drain contact hole 185c of the second passivation layer 180y is formed in the common electrode 270.

As described, as the size and the width of the second drain contact hole 185b of the common electrode 270 are greater than the size and the width of the third drain contact hole 185c, the edge of the third drain contact hole 185c covers the edge of the second drain contact hole 185b, and accordingly the second drain contact hole 185b cannot be connected with the pixel electrode 191 formed on the second passivation layer 180y.

In addition, the second drain contact hole 185a of the common electrode 270 and the third drain contact hole 185c of the second passivation layer 180y are located in the inclined portion S of the first drain contact hole 185a formed in the organic layer 80. Thus, a cutting of the pixel electrode 191 due to a step difference formed in the contact portion by the third drain contact hole 185c protruded more than the second drain contact hole 185b can be prevented.

Next, the photosensitive pattern 400a is removed as shown in FIG. 24 to FIG. 27.

As described, the common electrode 270, the connecting member 96, and the second passivation layer 180y are formed together through one photolithography process, and then as shown in FIG. 1 to FIG. 4, the pixel electrode 191 having the fourth thickness T2 and the contact auxiliary member 97 are formed such that the lower panel 100 is formed. As previously described, the fourth thickness T2 of the pixel electrode 191 is about two times thicker than the third thickness T1 of the common electrode 270, and therefore a cutting of the pixel electrode 191 due to a step difference formed in the contact portion by the third drain contact hole 185c that is protruded more than the second drain contact hole 185b can be prevented.

After the lower panel 100 is formed, the upper panel 200 is formed and then the liquid crystal layer 3 is injected between the two panels 100 and 200 such that the liquid crystal display is completed as shown in FIG. 1 to FIG. 4.

As described, the common electrode 270 and the second passivation layer 180y can be simultaneously formed according to the manufacturing method of the liquid crystal display of the present exemplary embodiment of the present invention so that an increase in manufacturing costs of the liquid crystal display can be prevented. In addition, according to the manufacturing method of the present exemplary embodiment of the present invention, the pixel electrode 191 and the common electrode 270 can be prevented from being connected and also a cutting of the pixel electrode 191 at the stepped portion can be prevented.

Figure 28:
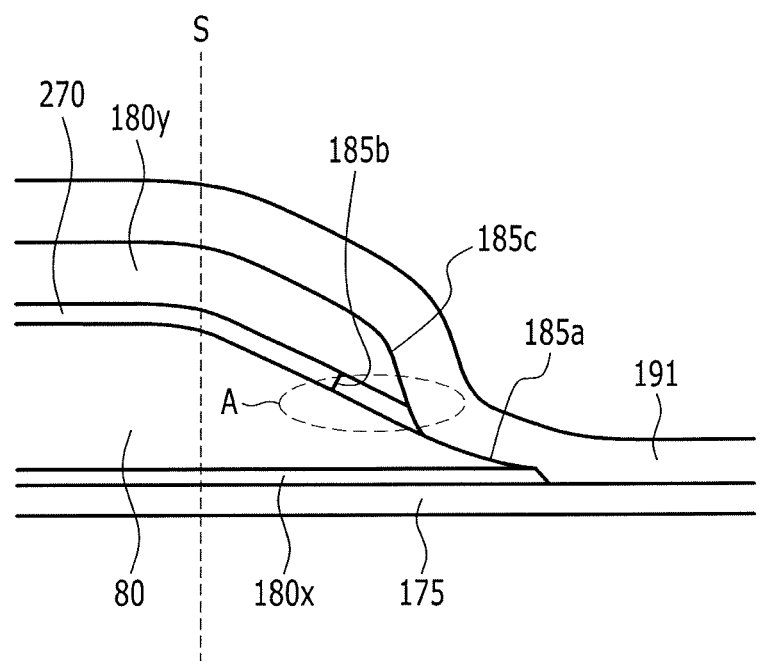
FIG. 28 is a schematic view that partially illustrates a liquid crystal display according to an exemplary embodiment of the present invention.

Thus will be described further detail with reference to FIG. 28. FIG. 28 is a schematic view that partially illustrates a liquid crystal display according to an exemplary embodiment of the present invention.

Referring to FIG. 28, the second drain contact hole 185a of the common electrode 270 and the third drain contact hole 185c of the second passivation layer 180y are formed to be located in the inclined portion S of the first drain contact hole 185a. Thus, the pixel electrode 191 can be prevented from being cut in a stepped portion A formed in the contact portion by the third drain contact hole 185c protruded more than the second drain contact hole 185b. In addition, as the pixel electrode 191 is sufficiently thick, the cutting of the pixel electrode 191 can be prevented.

Figure 29:
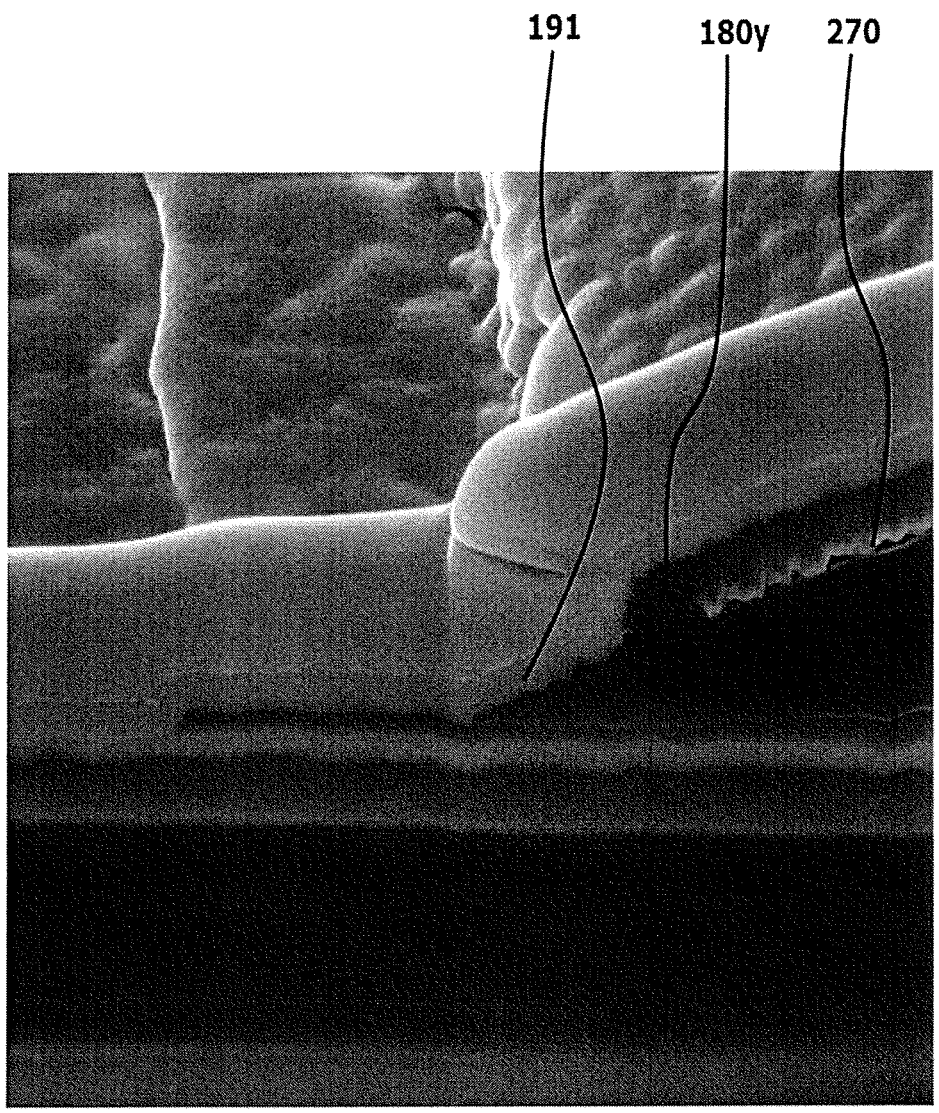
FIG. 29 is an electron micrograph illustrating a cross-section of a liquid crystal display according to an experimental example of the present invention.

Now, an experimental example of an exemplary embodiment of the present invention will be described with reference to FIG. 29. FIG. 29 is an electron micrograph illustrating a cross-section of a liquid crystal display according to an experimental example of an exemplary embodiment of the present invention.

Referring to FIG. 29, as in the liquid crystal display according to an exemplary embodiment of the present invention, a second drain contact hole 185b of a common electrode 270 and a third drain contact hole 185c of a second passivation layer 180y are formed to be located in an inclined portion S of a first drain contact hole 185a formed in an organic layer 80, and when a pixel electrode 191 is thick, the pixel electrode 191 can be stably formed without being cut by a step difference between the third drain contact hole 185c and the second drain contact hole 185b.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A liquid crystal display comprising:
a first substrate;
a gate line and a data line disposed on the first substrate;
a thin film transistor connected to the gate line and the data line;
a first passivation layer disposed on the thin film transistor;
a first electrode disposed on the first passivation layer;
a second passivation layer disposed on the first electrode; and
a second electrode disposed on the second passivation layer,
wherein a first edge of the first electrode and a second edge of the second passivation layer have substantially a same plane shape as each other, and the second edge of the second passivation layer protrudes more than the first edge of the first electrode.

2. The liquid crystal display of claim 1, wherein the first passivation layer comprises a first drain contact hole exposing a drain electrode of the thin film transistor, the first electrode comprises a second drain contact hole exposing the drain electrode, the second passivation layer comprises a third drain contact hole exposing the drain electrode,
the first drain contact hole, the second drain contact hole, and the third drain contact hole overlap with each other, and
a size of the second drain contact hole is greater than a size of the third drain contact hole.

3. The liquid crystal display of claim 2, further comprising an organic layer disposed between the first passivation layer and the first electrode,
the first drain contact hole is disposed in the first passivation layer and the organic layer, and
an edge of the second drain contact hole and an edge of the third drain contact hole overlap with an inclined portion that forms the first drain contact hole of the organic layer.

4. The liquid crystal display of claim 3, wherein the second electrode is connected with the drain electrode through the first drain contact hole, the second drain contact hole, and the third drain contact hole, and
a thickness of the second electrode is greater than a thickness of the first electrode.

5. The liquid crystal display of claim 4, wherein the thickness of the second electrode is about two times thicker than the thickness of the first electrode.

6. The liquid crystal display of claim 2, wherein the second electrode is connected with the drain electrode through the first drain contact hole, the second drain contact hole, and the third drain contact hole, and
a thickness of the second electrode is greater than a thickness of the first electrode.

7. The liquid crystal display of claim 6, wherein the thickness of the second electrode is about two times thicker than the thickness of the first electrode.

8. The liquid crystal display of claim 1, further comprising a gate signal transmission pad portion disposed on a same layer as the data line,
wherein the gate line comprises a gate pad portion,
the first passivation layer comprises a first pad contact hole exposing the gate pad portion and a second pad contact hole exposing the gate signal transmission pad portion,
a connection member disposed on the first pad contact hole and the second pad contact hole,
an insulation portion disposed on the same layer as the second passivation layer and is disposed on the connecting member, and wherein an edge of the insulation portion protrudes more than an edge of the connection member.

9. The liquid crystal display of claim 1, wherein the data line comprises a data pad portion,
the first passivation layer comprises a third pad contact hole exposing the data pad portion,
a contact auxiliary member is disposed on the third pad contact hole, and
the second passivation layer does not overlap with the data pad portion.

10. A liquid crystal display comprising:
a first substrate;
a gate line and a data line disposed on the first substrate;
a thin film transistor connected to the gate line and the data line;
a first passivation layer disposed on the thin film transistor;
a first electrode disposed on the first passivation layer;
a second passivation layer disposed on the first electrode; and
a second electrode disposed on the second passivation layer,
wherein the first passivation layer comprises a first drain contact hole exposing a drain electrode of the thin film transistor, the first electrode comprises a second drain contact hole exposing the drain electrode, and the second passivation layer comprises a third drain contact hole exposing the drain electrode,
the first drain contact hole, the second drain contact hole, and the third drain contact hole overlap with each other, and
a size of the second drain contact hole is greater than a size of the third drain contact hole.

11. The liquid crystal display of claim 10, further comprising an organic layer disposed between the first passivation layer and the first electrode,
wherein the first drain contact hole is disposed in the first passivation layer and the organic layer, and
an edge of the second drain contact hole and an edge of the third drain contact hole overlap with an inclined portion that forms the first drain contact hole of the organic layer.

12. The liquid crystal display of claim 10, wherein the second electrode is connected with the drain electrode through the first drain contact hole, the second drain contact hole, and the third drain contact hole, and
a thickness of the second electrode is greater than a thickness of the first electrode.

13. The liquid crystal display of claim 12, wherein the thickness of the second electrode is about two times thicker than the thickness of the first electrode.

14. The liquid crystal display of claim 10, wherein the second electrode is connected with the drain electrode through the first drain contact hole, the second drain contact hole, and the third drain contact hole, and
a thickness of the second electrode is greater than a thickness of the first electrode.

15. The liquid crystal display of claim 14, wherein the thickness of the second electrode is about two times thicker than the thickness of the first electrode.

16. The liquid crystal display of claim 10, further comprising a gate signal transmission pad portion disposed on the same layer as the data line,
wherein the gate line comprises a gate pad portion,
the first passivation layer comprises a first pad contact hole exposing the gate pad portion and a second pad contact hole exposing the gate signal transmission pad portion,
a connection member is disposed on the first pad contact hole and the second pad contact hole,
an insulation portion is disposed on the same layer as the second passivation layer and is disposed on the connecting member, and
wherein an edge of the insulation portion protrudes more than an edge of the connection member.

17. The liquid crystal display of claim 10, wherein the data line comprises a data pad portion,
the first passivation layer comprises a third pad contact hole exposing the data pad portion,
a contact auxiliary member is disposed on the third pad contact hole, and
the second passivation layer does not overlap with the data pad portion.

18. A method for manufacturing a liquid crystal display, comprising:
forming a gate line, a data line, and a thin film transistor connected to the gate line and the data line on a first substrate;
forming a first passivation layer including a first drain contact hole that exposes a drain electrode of the thin film transistor on the thin film transistor;
forming a first electrode including a second drain contact hole exposing the drain electrode and a second passivation layer including a third drain contact hole exposing the drain electrode together on the first passivation layer through one photolithography process;
forming a second electrode on the second passivation layer;
forming the first drain contact hole, the second drain contact hole, and the third drain contact hole to be overlapped with each other; and
forming a size of the second drain contact hole to be greater than a size of the third drain contact hole.

19. The method for manufacturing the liquid crystal display of claim 18, wherein the forming of the first electrode and the second passivation layer together comprises:
depositing a first layer on the first passivation layer;
depositing a second layer on the first layer;
forming a photosensitive film pattern on the second layer;
etching the second layer using the photosensitive film pattern as a mask; and
over-etching the first layer using the photosensitive film pattern as a mask.

20. The method for manufacturing the liquid crystal display of claim 19, further comprising forming an organic layer between the first passivation layer and the first electrode,
wherein the first drain contact hole is formed in the first passivation layer and the organic layer,
the organic layer includes an inclined portion at a peripheral area of the first drain contact hole, and
an edge of the second drain contact hole and an edge of the third drain contact hole are formed to be overlapped with the inclined portion of the organic layer.

21. The method for manufacturing the liquid crystal display of claim 20, wherein
the second electrode is formed to be connected with the drain electrode through the first drain contact hole, the second drain contact hole, and the third drain contact hole, and
a thickness of the second electrode is greater than a thickness of the first electrode.

22. The method for manufacturing the liquid crystal display of claim 21, wherein a thickness of the second electrode is about two times thicker than a thickness of the first electrode.

23. The method for manufacturing the liquid crystal display of claim 18, wherein the second electrode is formed to be connected with the drain electrode through the first drain contact hole, the second drain contact hole, and the third drain contact hole, and a thickness of the second electrode is greater than a thickness of the first electrode.

24. The method for manufacturing the liquid crystal display of claim 23, wherein the thickness of the second electrode is about two times thicker than the thickness of the first electrode.

25. The method for manufacturing the liquid crystal display of claim 18, wherein the gate line comprises a gate pad portion, the forming of the first passivation layer further comprises forming a first pad contact hole exposing the gate pad portion, and the forming of the first electrode and the second passivation layer further comprises forming a connection member on the first pad contact hole and forming an insulation portion formed of the same layer as the second passivation layer on the connecting member, and wherein an edge of the insulating layer is protruded more than an edge of the connection member.

26. The method for manufacturing the liquid crystal display of claim 18, wherein the data line comprises a data pad portion, the forming of the first passivation layer further comprises forming a third pad contact hole exposing the data pad portion, the forming of the second electrode further comprises forming a contact auxiliary member on the third pad contact hole, and the second passivation layer is formed to not be overlapped with the data pad portion.

* * * * *